United States Patent [19]

Cunningham et al.

[11] Patent Number: 5,480,813
[45] Date of Patent: Jan. 2, 1996

[54] ACCURATE IN-SITU LATTICE MATCHING BY REFLECTION HIGH ENERGY ELECTRON DIFFRACTION

[75] Inventors: John E. Cunningham, Lincroft; Keith W. Goossen, Aberdeen; Rajiv N. Pathak, Matawan, all of N.J.

[73] Assignee: AT&T Corp., Murray Hill, N.J.

[21] Appl. No.: 263,305

[22] Filed: Jun. 21, 1994

[51] Int. Cl.$^6$ ................................................. H01L 21/205
[52] U.S. Cl. ............................ 437/7; 437/105; 437/107; 437/133; 117/86
[58] Field of Search ............................... 437/7, 105, 107, 437/131, 132, 133; 148/DIG. 160; 117/85, 86, 108; 427/8, 9

[56] References Cited

U.S. PATENT DOCUMENTS

| | | | |
|---|---|---|---|
| 3,751,310 | 8/1973 | Cho | 437/107 |
| 4,818,079 | 4/1989 | Maserjian | 359/299 |
| 4,904,045 | 2/1990 | Alferness et al. | 385/37 |
| 5,094,974 | 3/1992 | Grunthaner et al. | 437/85 |
| 5,122,222 | 6/1992 | Turner et al. | 117/86 |
| 5,148,025 | 9/1992 | Ahn et al. | 250/305 |
| 5,185,289 | 2/1993 | Meier et al. | 437/129 |
| 5,200,201 | 4/1993 | Kawai et al. | 117/86 |
| 5,238,525 | 8/1993 | Turner et al. | 118/85 |
| 5,251,225 | 10/1993 | Eglash et al. | 372/45 |
| 5,254,207 | 10/1993 | Nishizawa et al. | 117/86 |
| 5,258,326 | 11/1993 | Morishima et al. | 437/107 |
| 5,272,356 | 12/1993 | Wen et al. | 257/21 |

OTHER PUBLICATIONS

Observation of Coherent Rayleigh Noise in Single-Source Bidirectional Optical Fiber Systems, Wood et al., Journal of Lightwave Technology, vol. 6, No. 2, Feb. 1, 1988, pp. 346–351.

*Dynamics of Film Growth of GaAs by MBE from Rheed Observations*, Neave et al., Applied Physics A, Springer-Verlag, Feb. 1983, pp. 1–8.

"Damped Oscillation in Reflection High Energy Electron Diffraction During GaAs MBE", Hove et al., Department of Electrical Engineering, University of Minnesota, J. Vac. Sci. Technol. B vol. 1, No. 2, Jul.–Sep. 1983, pp. 741–746.

*Frequency–Domain Analysis of Time–Dependent Reflection High–Energy Electron Diffraction Intensity Data*, Turner et al., Lincoln Laboratory, Massachusetts Institute of Technology, Dec. 1989 J. Vac. Sci. Technol. B, vol. 8, No. 2, Mar.–Apr. 1990, pp. 283–287.

*Is the Cation Sticking Coefficient Unity in Molecular Beam Epitaxy At Low Temperature*, Chiu et al., AT&T Bell Labo (List continued on next page.)

*Primary Examiner*—George Fourson
*Assistant Examiner*—Thomas G. Bilodeau

[57] ABSTRACT

An in-situ method is disclosed for highly accurate lattice matching using reflection high energy electron diffraction dynamics. The method includes the steps of providing a substrate of a first semiconductor material and initiating growth of a second semiconductor material thereon. The oscillation amplitude of intensity I of waveform cycles is monitored using reflection high energy electron diffraction. A maximum intensity $I^+$ and a minimum intensity $I^-$ is determined over a predetermined number of waveform cycles. The intensity drop $\Delta I$ from initial reflectivity to minimum reflectivity of the waveform cycles is determined and a normalized figure of merit FM is calculated for the predetermined number of waveform cycles using the relationship:

$$FM = \frac{\Sigma(I^+I^-)}{\Delta I}$$

The fluxes of the second semiconductor material are then adjusted to maximize FM and optimize lattice matching. A multiple quantum well light modulator is also provided including a semiconductor substrate of InP, a multiple quantum well region, disposed above the InP substrate, composed of InGaAs and having a thickness of about 4 μm. The modulator is characterized by a lattice mismatch of less than $2\times10^{-4}$.

8 Claims, 9 Drawing Sheets

OTHER PUBLICATIONS ratories, N.J., Amer. Institute of Physics, Appl. Phys. Lett., vol. 57, No. 14, Oct. 1, 1990, pp. 1425–1427.

*Growth Rate and Composition Calibration of III/V Materials on GaAs and InP Using Reflection High–Energy Electron Diffraction Oscillations,* Kopf et al., AT&T Bell Labs, N.J., J. Vac. Sci. Technol. B, vol. 9 No. 4 Jul./Aug. 1991, pp. 1920–1923.

*Optically Monitoring and Controlling Epitaxial Growth,* Aspnes et al., Journal of Crystal Growth, 120, 71–77, North–Holland, 1992.

*In–Situ Control of Ga(Al) As MBE Layers By Pyrometric Interferometry,* Grothe et al., Journal of Crystal Growth, 127, 1010–1013, North–Holland, 1993.

*InGaAs/InP P–I (MQW)–N Surface Normal Electroabsorption Modulators Exhibiting Better than 8:1 Contrast Ratio for 1.55 µm Applications Grown by Gas Source MBE,* Pathak et al., AT&T Bell Laboratories, N.J. (date unknown).

ACCURATE IN-SITU LATTICE MATCHING BY REFLECTION HIGH ENERGY ELECTRON DIFFRACTION

BACKGROUND

1. Technical Field

The present invention relates to an accurate in-situ growth technique based upon reflection high energy electron diffraction dynamics for accurate lattice matching of dissimilar materials.

2. Discussion of Related Art

The invention of low loss optical fibers for use as a practical optical transmission medium has stimulated tremendous growth in other areas relating to optical communications. The term "optical" as used herein refers not only to visible light but to any electromagnetic radiation which can be transmitted within dielectric fibers. The term refers to electromagnetic radiation generally of wavelength between 0.1 and 50 microns. Recently, fiber to the home systems have been proposed which would utilize surface normal electroabsorption modulators to convert downstream light into upstream data. One such system uses a single fiber to connect two locations and effects bidirectional data transmission over this fiber using a single laser. See, e.g., T. Wood et al., Elec. Lett., Vol. 22, pgs. 346–352 (1986) and T. Wood et al., J. Light Tech., Vol. 6, pages 527–528 (1988) the disclosures of which are incorporated herein by reference. This system uses a light modulator that imprints data on the fiber return and thus avoids the need for a second laser at the subscriber location. Particularly useful for modulation are electrooptic devices whose optical properties, such as absorption or index of refraction, may be varied by application of an appropriate electrical signal. Exemplary of such electrooptical devices is the multiple quantum well (MQW). The MQW includes a plurality of layers of different semiconductor materials such as gallium arsenide (GaAs) and aluminum gallium arsenide (AlGaAs). Other examples of suitable materials include such III–V systems as InAs/GaAs, (In,Ga)As/GaAs,(In,Ga)As/InP and (In,Ga)As/(In,Al)As. The layers alternate between wide bandgap material and narrow bandgap material. Appropriate selection of materials, compositions and layer thicknesses permits fabrication of unique electrooptic devices.

When used as a modulator, the MQW exhibits a significant shift in the absorption edge due to the change in the confinement energy associated with the applied electric field and consequent distortion of the well. This shift in absorption is the basis for the MQW as a modulator. Since the applied field can significantly alter the light absorption properties of a properly biased MQW, light passing through the MQW will be modulated.

In the fabrication of MQW's, thin films of the semiconductor materials are grown or deposited onto substrate material in a wide variety of reactors. One such reactor is a molecular beam epitaxy (MBE) reactor. See, e.g., U.S. Pat. No. 3,751,310 to Cho. Since 1983 it has become apparent that the oscillatory behavior observed in the intensity of the RHEED features on initiation of growth is directly related to the growth rate. See, e.g., J. H. Neave et al., Appl. Phep. A31,1 (1983) and J. M. VanHove et al., J. Vac. Sci. and Technol. B1,741, (1983) the disclosures of which are incorporated herein by reference. In tact, monitoring of the period of RHEED intensity oxillations has become an established technique for the in-situ calibration of beam fluxes and the control alloy compositions for the growth of lattice matched heterostructures. The accuracy of the analysis of the RHEED oscillatory data, for a thin layer GaAs/AlGaAs material system, is about 1%. See, e.g. Turner et al., J. Vac. Sci. Technol. B8, 283 (1990). Hence, there is a real need for a technique which allows accurate lattice matching conditions to be arrived at in a quick and reproducible manner for the realization of a variety of semiconductor optical devices such as, for example, modulators, lasers and detectors.

SUMMARY

An in-situ method is disclosed for highly accurate lattice matching using reflection high energy electron diffraction dynamics. The method includes the steps of providing a substrate of a first semiconductor material and initiating growth of a second semiconductor material thereon. The intensity I of a diffraction feature generated by using an electron beam (RHEED) is monitored versus time. A normalized figure of merit FM is calculated by using the relationship:

$$FM = \frac{\Sigma(I^+ - I^-)}{\Delta I}$$

By maximizing the value of FM, accurate lattice matching on the order of about two parts in ten thousand can be obtained.

A multiple quantum well light modulator is also provided including a semiconductor substrate of InP, a multiple quantum well region, disposed above the InP substrate, composed of InGaAs quantum well and InP barriers and having a thickness of about 4 µm. The modulator is characterized by a lattice mismatch of less than $2 \times 10^{-4}$.

BRIEF DESCRIPTION OF THE DRAWINGS

Various methods are described hereinbelow with reference to the drawings, wherein.

DETAILED DESCRIPTION OF PREFERRED EMBODIMENTS

Figure 1:
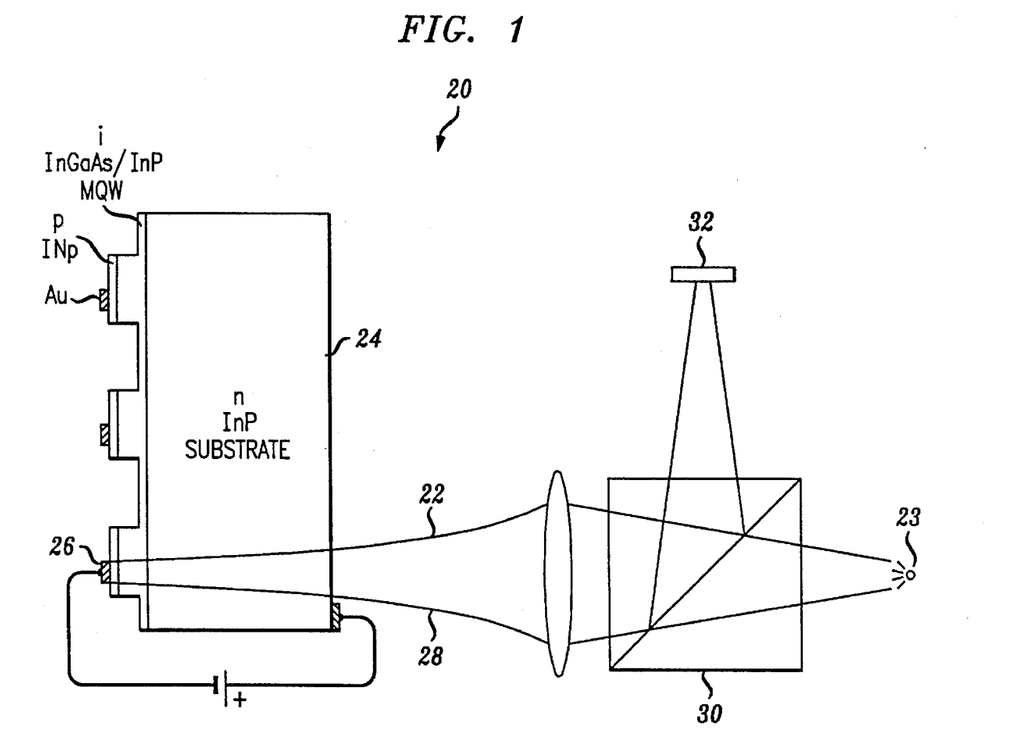
FIG. 1 is a schematic illustration of a reflectivity measurement test set up for characterization of electroabsorption modulator devices.

The invention will now be described in detail in connection with the drawings. FIG. 1 is a schematic drawing of a preferred embodiment of a measurement test set up, shown generally at 20 for use with the invention as applied to a modulator. Surface normal modulators are attractive candidates for fiber to the home applications where their amenability to processing in large two dimensional arrays would help keep unit costs down. In order to be useful, however, contrast and absorption values must be acceptable in the 1.3 to 1.55 μm regime corresponding to the low dispersion, low loss windows for optical fibers.

Surface normal $In_{0.53}Ga_{0.47}As/InP$ MQW modulators operating at 1.55 μm are particularly attractive for this application. Such systems need modulators with on-off ratios of between 8:1 to 10:1 at 155 μm. However, the absorption coefficient exhibited by this material system is only about 40% of the value exhibited by the GaAs/AlGaAs material system. In order to overcome this drawback an intrinsic MQW region over 4 μm thick must be employed. At this thickness, lattice mismatches of several parts in $10^{-4}$ can cause strain relief resulting in an inhomogeneously broadened exciton and thereby a reduced contrast ratio. Highly accurate lattice matching thus becomes very important.

To achieve this objective with a high yield, an in-situ growth approach based on RHEED dynamics is disclosed that allows InGaAs to be accurately lattice matched to an InP substrate. This approach is based on an analysis of the intensity amplitude as opposed to conventional approaches wherein growth rates are determined by an analysis of oscillation frequency. FIG. 1 is a schematic illustration of a reflectively measurement test set up for characterization of electroabsorption modulator devices.

Figure 2:
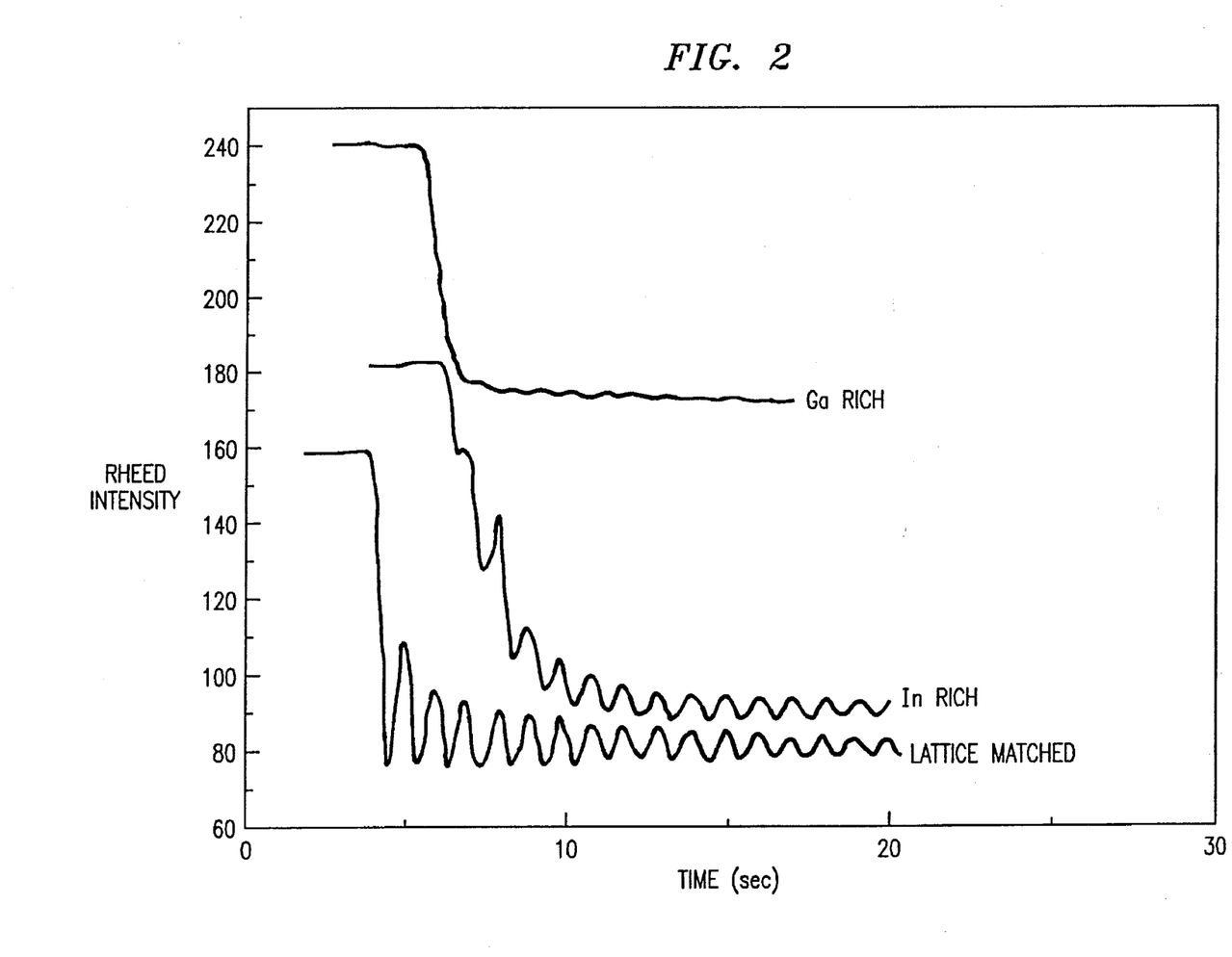
FIG. 2 is a plot of RHEED intensity oscillations for different In and Ga flux ratios.
Figure 3:
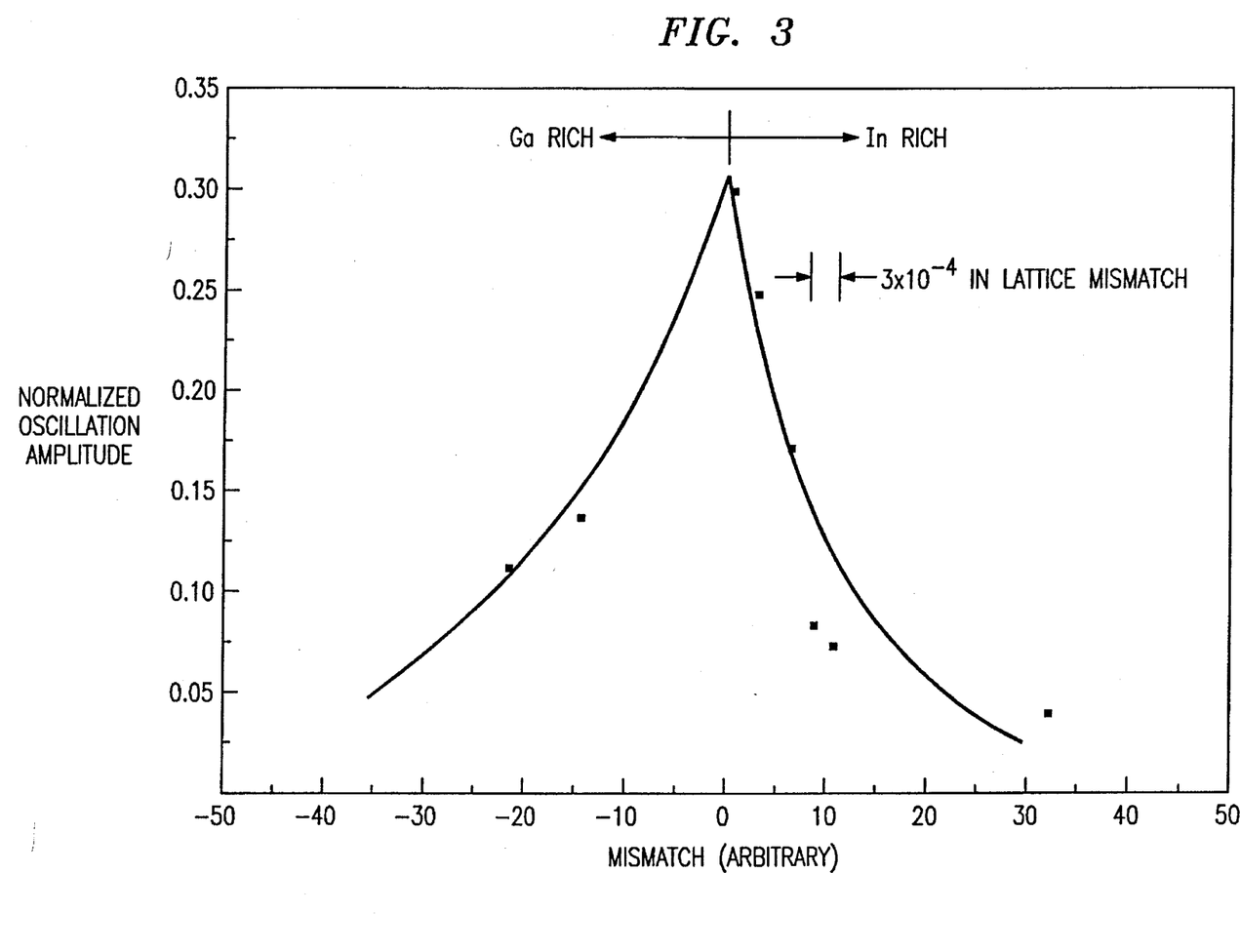
FIG. 3 is a plot of the variation in oscillation amplitude for a systematic change in lattice mismatch.

FIG. 2 shows a plot of the intensity oscillation of RHEED for different In and Ga flux ratios. Accurate lattice matching conditions are shown in FIG. 2 as clearly defined oscillations. But for slight mismatches, the RHEED oscillation amplitude is degraded both for Ga and In rich lattice mismatches. Even though the intensity oscillation amplitude has significantly changed (because of the mismatch) the oscillation frequency does not show a reproducible change. In fact, it is not possible to detect a change in oscillation frequency with reliability to better than 1%. FIG. 3 is a plot of the FM for a systematic change in lattice mismatch. Clearly the peak establishes perfect lattice matching conditions. The scale shows that mismatches as low as a few parts in $10^4$ can be easily distinguished. This method has other application to many Group III–V systems such as, for example, InGaP/GaAs, GaAsSb/InP or ternaries, quaternaries under lattice matched conditions.

Example 1

To exemplify the viability of this approach measurements were made on p-I(MQW)-n surface normal modulators incorporating thick intrinsic regions where the new process was used to obtain highly accurate lattice matching conditions. The data also shows that even mismatches of a few parts in $10^{-4}$ result in an inhomogeneous broadening of the excitonic resonance and hence a degradation of performance. See Table 1.

The structures were grown by Gas Source MBE in a VG-80 H MBE system modified to handle gas flow. Pure $AsH_3$ and $PH_3$ constituted the Group V fluxes, while elemental Ga and In were used as the Group III sources. A standard VG electron gun, operated at 15 KV with a filament current of 2.25 A is used to generate the RHEED pattern. The image generated on the phosphor screen is captured with a CCD camera which sends it to a TV monitor and also to a frame grabber card capable of 256 bit resolution located in a 486 desktop PC for display on the video monitor. The card is capable of sampling the image 30 times a second. Software written for this card allows the user to define boxes of different pixel sizes which function as a detector. By aligning the pixel box over a diffraction pattern, feature RHEED intensity oscillations can be recorded. The position of this aligned pixel box once defined remains fixed. Hence, once an aforesaid pixel box is defined and fixed, any lateral drift in the diffraction geometries, can be corrected for by realigning the diffraction spot within the confines of the pixel box. A typical calibration run consists of recording the RHEED oscillations, and then transporting the data file to a program which allows us to perform both time and frequency domain analysis on the acquired data set. Using this setup a variance on the order of 1% in the growth rate between consecutive measurements can be achieved.

For our experiments RHEED intensity measurements were performed on a small (~0.5 $cm^{-2}$)n+InP wafer mounted at the center of a molybdenum block with indium. Use of a small RHEED sample further minimizes any error. Further, the flux distribution over such a small piece can be assumed to be uniform. After thermal desorption of the oxide under a P flux, a layer of InP was first grown for an hour so as to allow the In cell to reach thermal equilibrium. At the same time, the Ga cell was also brought up to temperature and held with the shutter closed. All measurements were made at a growth temperature of 500° C. on a Group V stabilized×2 reconstruction along the [110] azimuth. The Group V to Group III flux ratio was maintained at approximately 2.5:1.

All the measurements were made on a fresh, fully recovered InP surface. Prior to initiating growth of InGaAs, the Group V gases were switched and $AsH_3$ was allowed to flow into the chamber for 30 sec. RHEED intensity data was then acquired from the specular spot of the diffraction pattern with a 5×5 pixel sized box over 75 sec. (30 sec. of actual intensity oscillations plus 45 sec. to record the recovery characteristics) at a sampling rate of 30 Hz. Upon completion of the measurement the Group V gases were once again switched and InP grown for 3 minutes before repeating the measurement. The set point of the In cell was held constant throughout the measurement sequence, while the Ga cell temperature was stepped to lower values. A five minute layer of InP was inserted between each successive change in Ga set point.

As can be see in FIG. 2, qualitatively different forms of oscillations were encountered corresponding to situations where the composition was either Ga rich, in rich or lattice mismatched by small amounts. In rich or lattice matched even by slight amounts under these conditions it was not possible to detect a reproducible change in the oscillation frequency FIG. 2.

Correlating lattice mismatch obtained from high resolution X-ray diffraction (HRXRD) measurements and measured linewidths from 77 KPL measurements on p-i(MQW)-n devices containing thick MQW intrinsic layer shows that even small amounts of lattice mismatch leads to strain relief leading to an associated inhomogeneous broadening Z of the excitonic resonance.

Results

Figure 4:
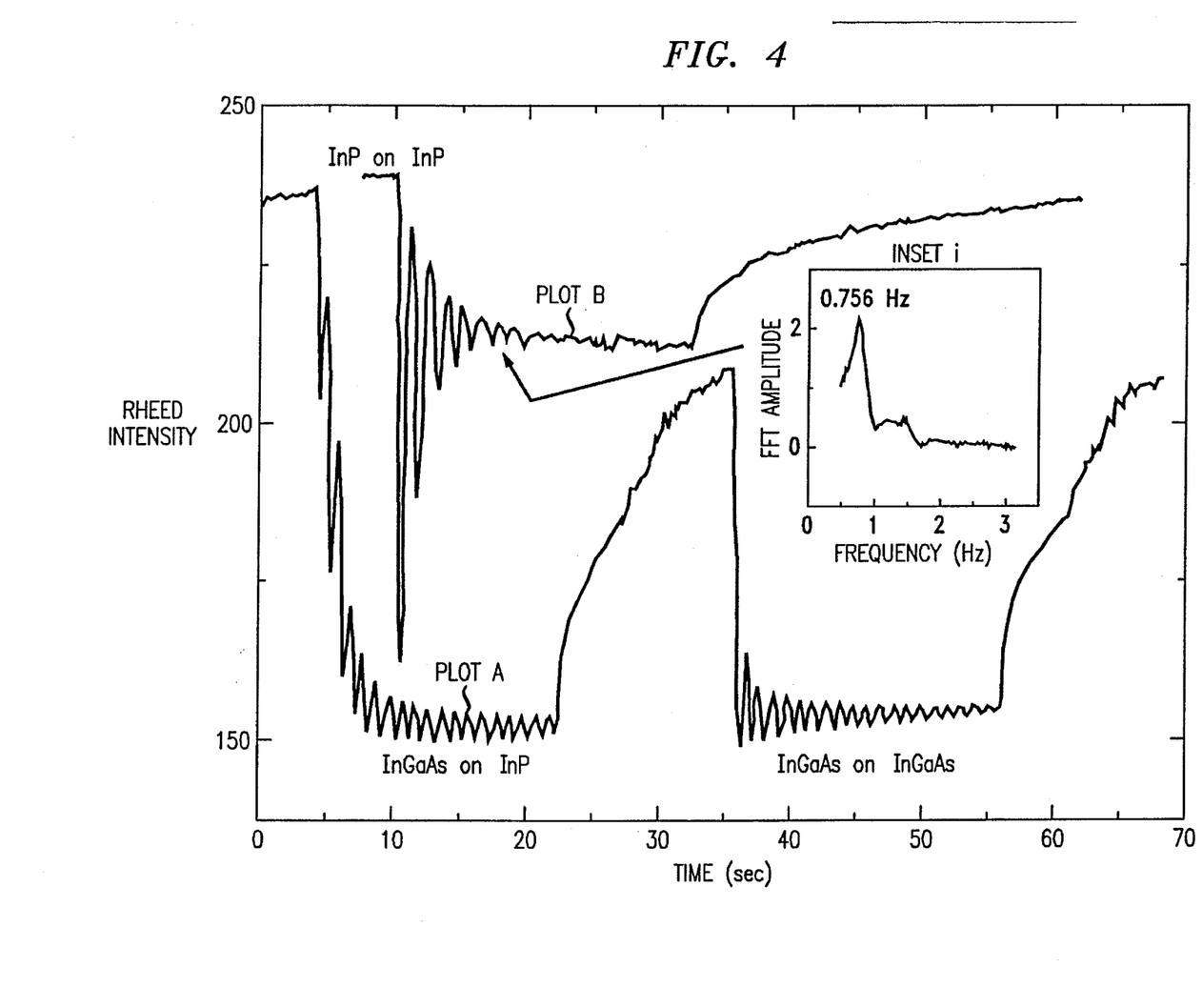
FIG. 4 is a compilation of two plots, plot A showing RHEED Intensity Oscillations for InP growth on InP, Plot B showing RHEED Intensity Oscillations for InGaAs on InP and InGaAs on InGaAs with Inset i showing a Fast Fourier Transform of the InP on InP RHEED oscillations.

FIG. 4 shows RHEED Intensity oscillations for growth very close to lattice match conditions. In Plot B, the oscillations observed for InP growth on InP are the usual type expected for binary III–V growth. Here, InP exhibits sinusoidal oscillations at the periodicity of the monolayer growth rate. Initial cycles of the intensity oscillations are rapidly damped symmetrically about maximum and minimum surface disorder as time approaches a terminal configuration of equilibrium surface roughness. Oscillations eventually vanish when rate of formation of surface step density (i.e., spontaneous nucleation from growth) becomes comparable to the rate of 2-D ledge motion (i.e., steps on terraces coalescence to the step ledge). When this happens the state of surface roughness does not change with time (terminal roughness). The recovery dynamics, when measured with no In deposition, also exhibit typical behavior as evidenced by step coalescence dynamics which is single stage. This corresponding to an island size that grows in time. Final RHEED intensity after complete recovery equals initial intensity before deposition.

The inevitable damping of the oscillations is an important factor that limits lattice matching when based on conventional RHEED frequency analysis of the growth rate. A Fast Fourier Transforms of the InP on InP RHEED oscillations is shown as Inset i in FIG. 4. The growth rate is Fourier Transform Limited 0.756 ML/s (center of the distribution) with a Full Width Half Maximum of 0.17 ML/s. In essence, by sampling the growth rate for an effective time of 6.0 s leads to an uncertainty in growth rate $\Delta\omega/\omega$ which is huge and impractical as a means to achieve lattice matching conditions. Alternatively, RHEED intensity oscillation observed in FIG. 9 for InGaAs growth on InP exhibit different characteristics that present a new and viable route to rapid lattice matching conditions. The differences show up in three ways and are dramatic when considering the fact that InGaAs growth in FIG. 4 is only slightly mismatched to InP ($5\times10^{-4}$).

First, the initial state of InGaAs on InP growth oscillations that exhibit asymmetrical damping characteristics. They depict initial damping of growth oscillations from configurations of maximum and minimum surface disorder that clearly differ from the symmetrical case observed for InP growth. In addition, the recovery dynamics for InGaAs on InP show distinct differences from InP recovery in two ways. First, time evolution in recovery dynamics is complex with evidence of multiple components present. Secondly, terminal intensity after recovery is significantly lower than initial InP intensity. All three differences appear to associate with increased surface step disorder that is associated with mismatched growth. In essence, because of the difference in areal monolayer density of the mismatched flux with the substrate additional surface steps are created to conserve total surface area. The surface steps from mismatched growth are additive to those normally generated by spontaneous nucleation during growth. The first few cycles of asymmetrical damping show that the surface steps from the mismatch are rapidly formed within the first four monolayers deposited. Also, the multicomponent recovery characteristics and lower total surface reflectivity correspond to island coalescence to a new configuration of surface steps on InP because of the mismatched growth.

To quantify this approach as a route to accurate in-situ lattice matching a normalized figure of merit, FM, is defined for the initial oscillation quality to be the sum of $(I^+-I^-)/\Delta I$ over the first four consecutive ML cycles measured. $I^+(I^-)$ correspond to maximum (minimum) intensity of each waveform cycle whereas $\Delta I$ is the intensity drop from initial InP reflectivity to minimum reflectivity of the oscillation waveform during deposition. When FM for the various growth cases in FIG. 4 is plotted (Plots A and B), the FM drops by a factor four from InP growth on InP to InGaAs growth in InP. The FM for InGaAs on InGaAs is 20% larger than InGaAs on InP because mismatched surface steps remain from the first sequence of InGaAs deposition on InP. For the latter case the asymmetry in oscillation damping has improved whereas InP intensity is 25% larger than recovered intensity after first InGaAs deposition. Recovered intensity after second InGaAs deposition equals recovered intensity after first InGaAs deposition.

Figure 9:
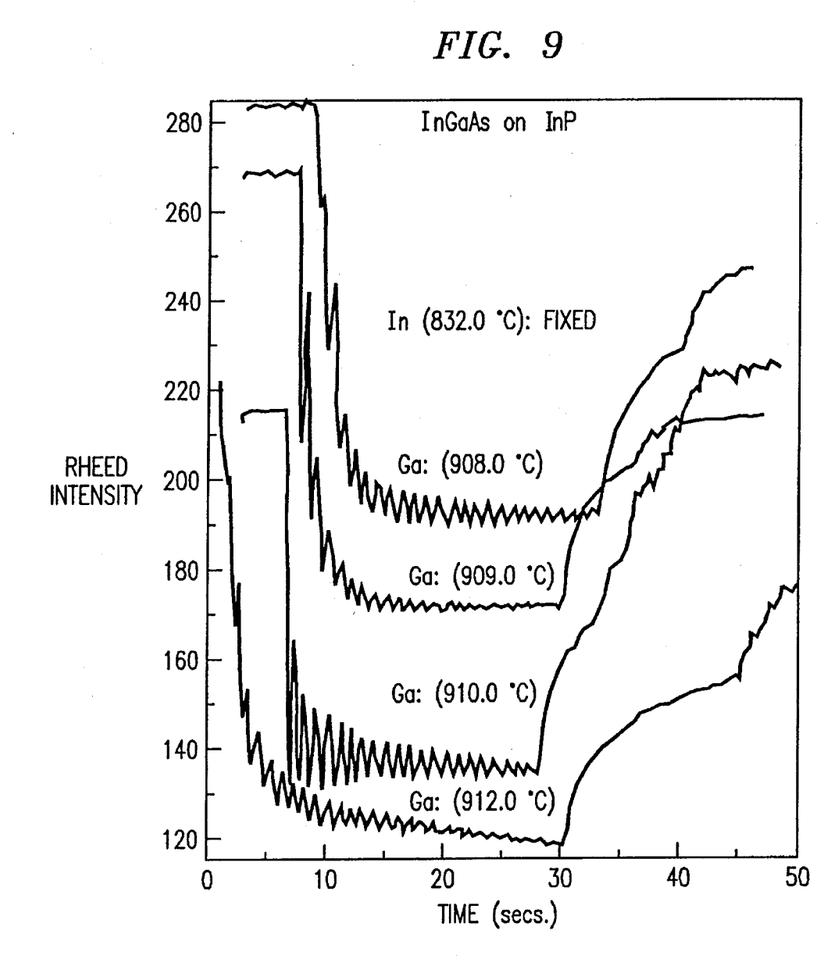
FIG. 9 is a plot showing RHEED intensity oscillations for different InGaAs lattice mismatches on InP.

FIG. 9 shows RHEED oscillations observed for different InGaAs mismatches on InP. This sequence was obtained by holding the In deposition rate fixed while varying the Ga growth rate from Ga rich to In rich conditions. Clearly, RHEED intensity during InGaAs deposition show systematic difference in the oscillation quality, recovery characteristics and intensity response. From the plot, a Ga cell temperature of 910.0 C is very close to lattice matched conditions.

In FIG. 3, the FM is shown over the same range of mismatch at finer step size than the coarse display of FIG. 9. The FM is highly sensitive to mismatch and is strongly peaked toward a lattice matching condition. The degradation in FM versus mismatch is symmetrical about Ga and In rich conditions with shape reminiscent of quality characteristics obtained by PL or X-ray diffraction measurements. Upon thick InGaAs layer deposition atop these sequences lattice matching on the basis of X-ray diffraction should be at the arrowed position.

Figure 5:
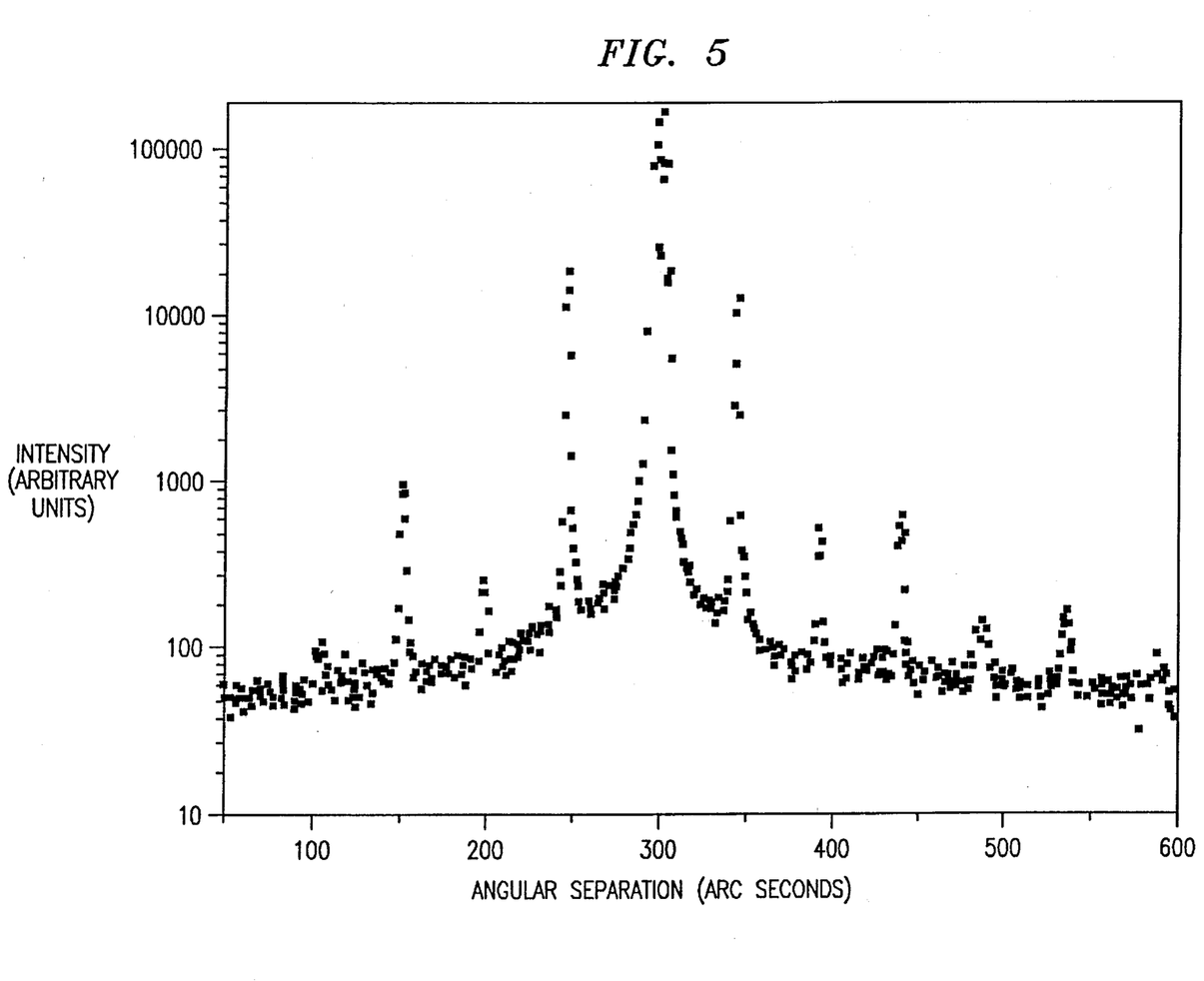
FIG. 5 is a High Resolution X-ray Diffraction scan of a p-i-n modulator incorporating 225 InGaAs/InP MQW's in the intrinsic region.

A typical HRXD scan of a p-i-n modulator incorporating 225 InGaAs/InP MQW's in the intrinsic region is shown in FIG. 5. The average lattice mismatch is obtained by determining the angular separation between the zeroth order peak (which corresponds to the reflection from the layer with the average lattice parameter of the super lattice stack) and the reflection from the substrate peak. In Table-1 the values of linewidth as determined from 77 K photoluminescence measurements are presented along with the mismatch values as determined from the HRXD measurement. As can be seen even small increases in the lattice mismatch result in a significant broadening (by a factor of almost two in going from a few parts in $10^{-5}$ to a few parts in $10^{-4}$) in the linewidth of the photo luminescence (PL) spectra. In device terms this broadening of the excitonic resonance means that to red shift the exciton from under the zero field E1-HH1 peak a higher electrical field is required, which further broadens the exciton due to associated polarization of the electron-hole pair, and hence the performance is degraded.

TABLE 1

| PL FWHM(meV) | Lattice mismatch, $\Delta a/a$ |
| --- | --- |
| 6.75 | $3.929 \times 10^{-5}$ |
| 9.217 | $1.9647 \times 10^{-4}$ |
| 11.472 | $2.59 \times 10^{-4}$ |

Figure 6:
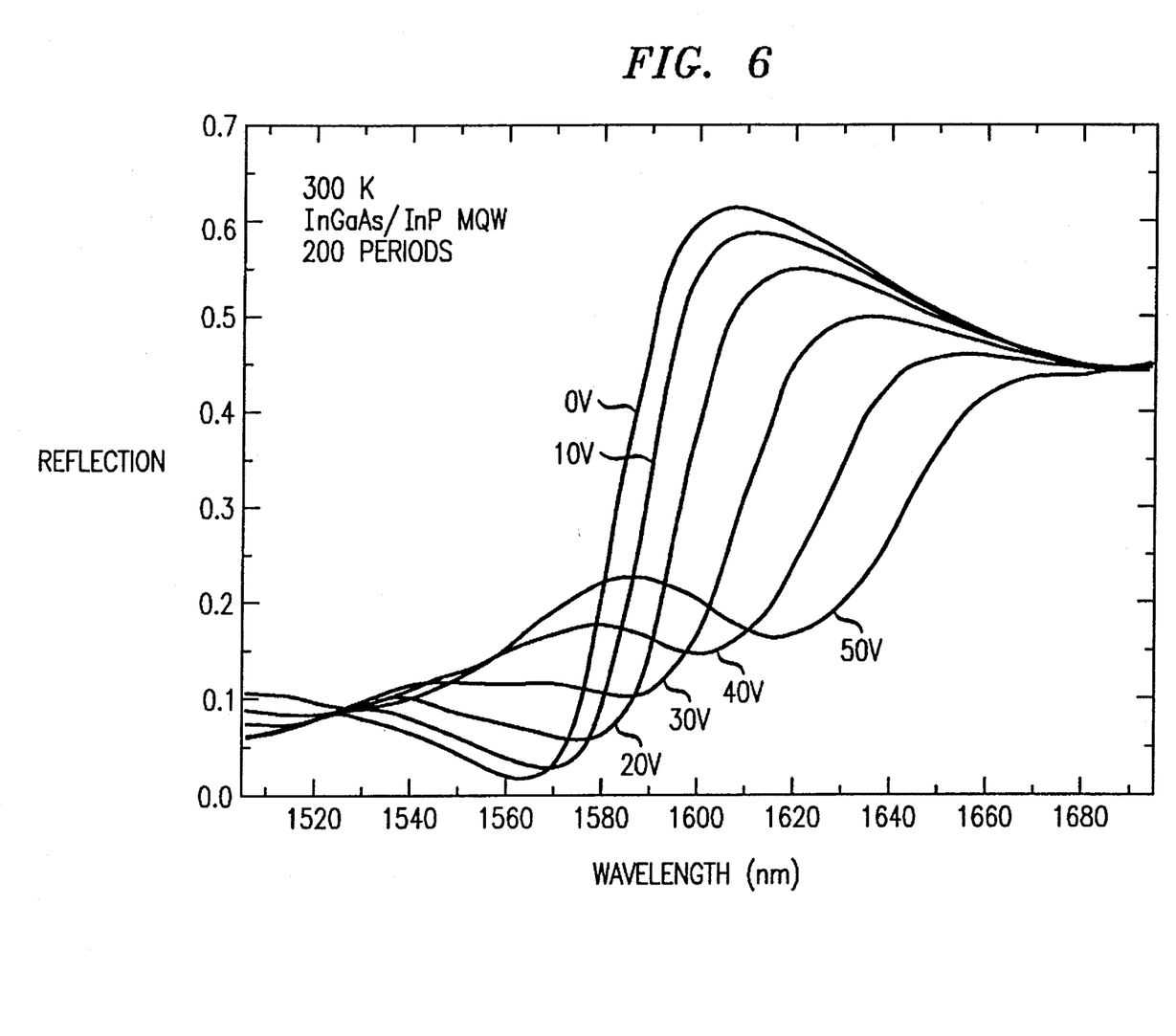
FIG. 6 is a plot of reflectivity spectra at 300 K of InGaAs/InP MQW.

Referring to FIG. 6, the reflectivity spectrum over an applied reverse bias range of 0 to 50 V is plotted. The half width half maximum (HWHM) of the zero applied bias exciton peak is 6.2 meV and the whole spectrum shows a good quantum confined stark effect (QCSE), with the peak shifting by more than 50 nm without significant broadening over the entire applied voltage range.

Figure 7:
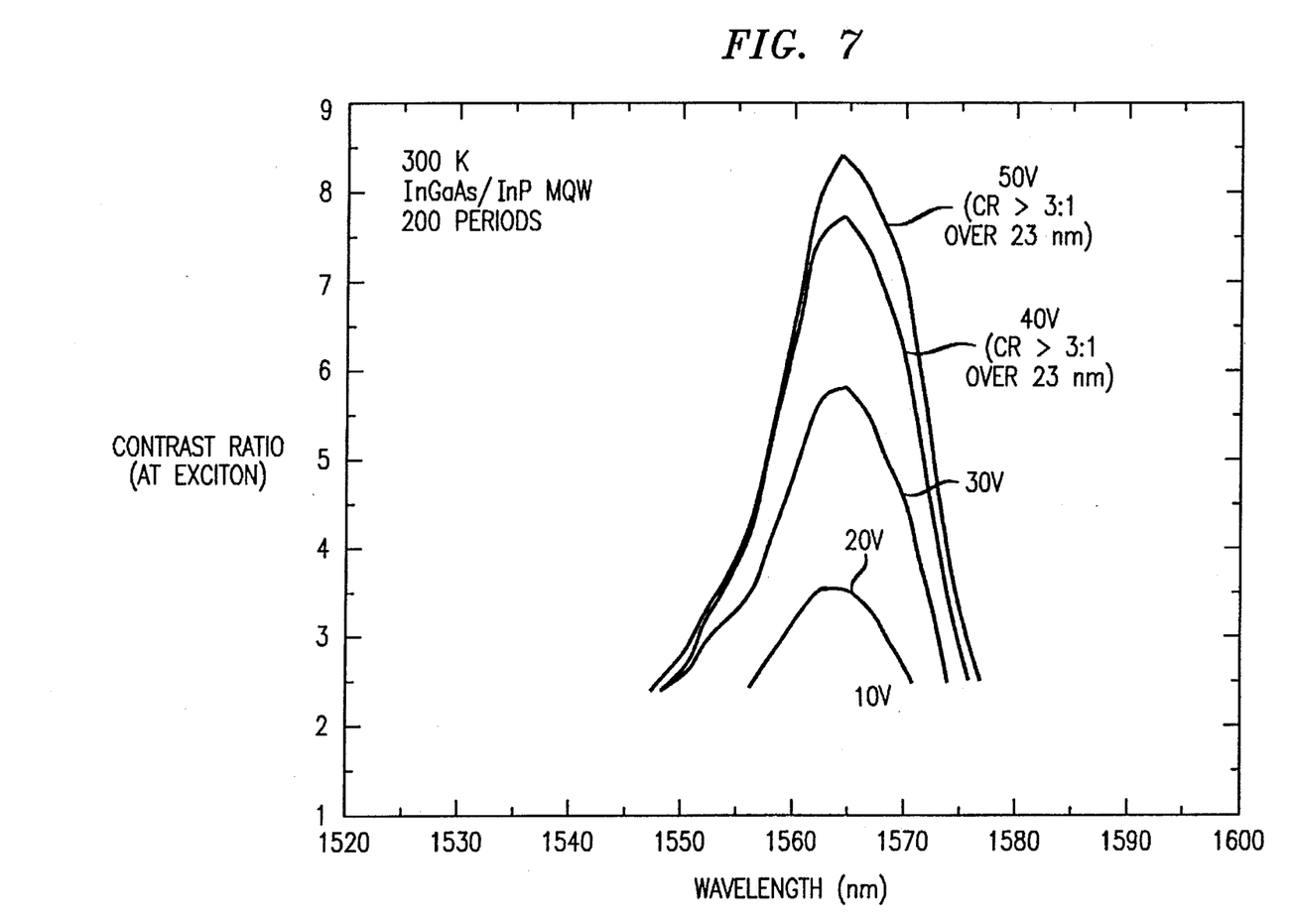
FIG. 7 is a plot of contrast ratio at exciton at 300 K InGaAs/InP MQW.
Figure 8:
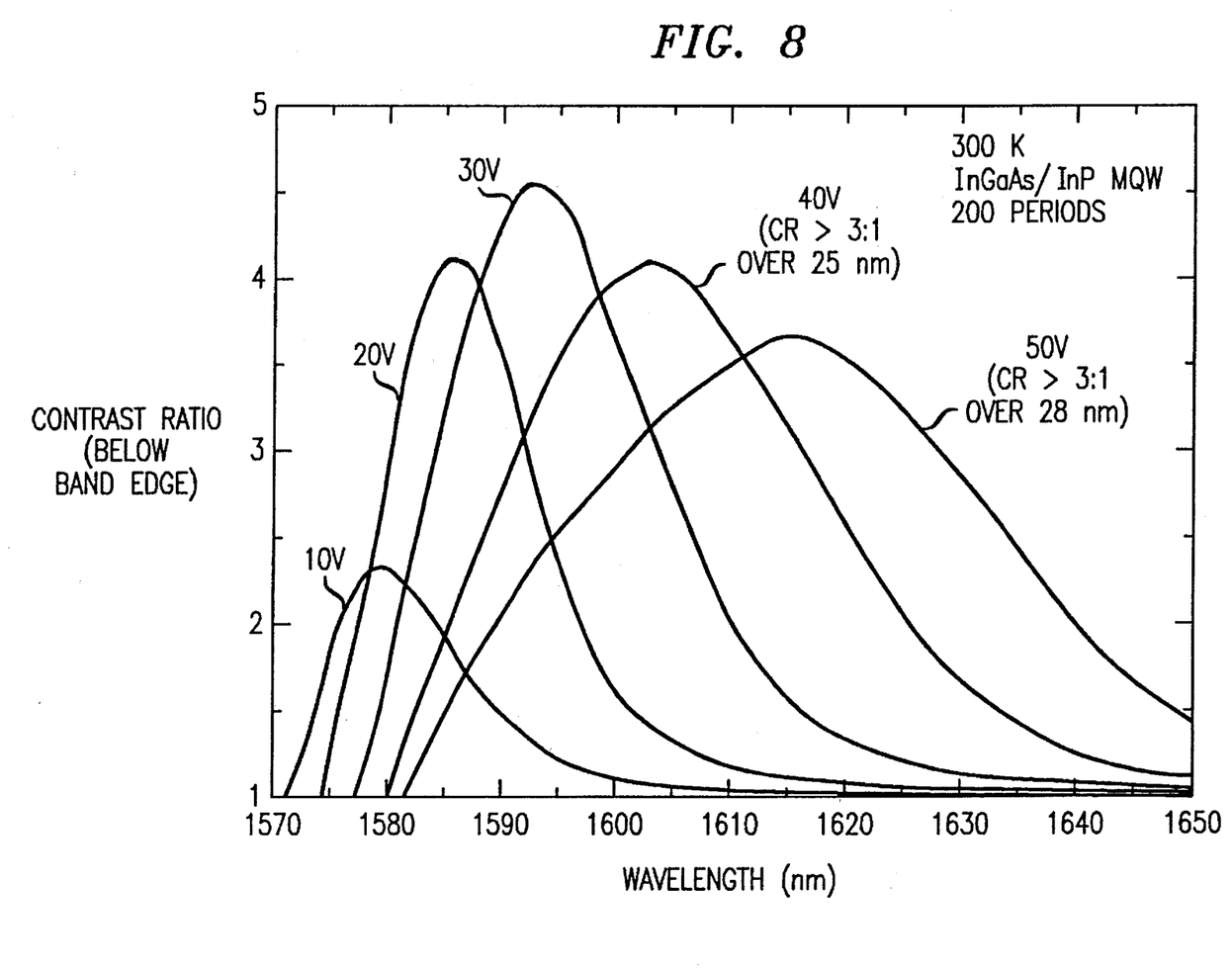
FIG. 8 is a plot of contrast ratio below band edge at 300 K of InGaAs/InP MQW.

Referring now to FIGS. 7 and 8, the contrast ratios for the normally off and normally on states calculated from the reflection spectra are shown. A high contrast ratio of better than 8:1 is achieved by operating the exciton resonance at an applied reverse bias of 50 V. Moreover, the bandwidth for greater than 3:1 contrast ratio, obtained at lower drive voltages is over 20 nm for both $\lambda_0$ and $\lambda_1$ modes of operation.

Thus, accurate in-situ lattice matching using RHEED dynamics has been presented. Use of this method has been applied to the growth of high contrast surface normal Multiple Quantum Well light modulators operating at 1.5 µm. What has been described is merely illustrative of the application of the principles of the present invention. Other arrangements and methods can be implemented by those skilled in the art without departing from the spirit and scope of the present invention.

We claim:

1. A method for in-situ lattice matching of semiconductor layers comprising the steps of:
   (a) providing a substrate of a first semiconductor material;
   (b) initiating growth of a second semiconductor material on said substrate semiconductor material;
   (c) monitoring intensity of reflection high energy electron diffraction spot of the second semiconductor material and said substrate over multiple waveform cycles;
   (d) determining a maximum $I^+$ and minimum $I^-$ intensity of each waveform cycle;
   (e) determining the intensity drop $\Delta I$ from initial reflectivity, measured prior to initiation of growth, to minimum reflectivity measured after starting growth;
   (f) calculating a normalized figure of merit FM for each said waveform cycle wherein $$FM = \frac{\Sigma(I^+ - I^-)}{\Delta I}$$

for each waveform cycles;
   (g) adjusting cell temperature to maximize FM and optimize lattice matching; and
   (h) repeating steps (c) through (g) as needed to form a plurality of layers of said second semiconductor material.

2. The method as in claim 1 wherein said substrate semiconductor material is selected from the group consisting of Group III–V compound semiconductors and Group IV elemental semiconductors.

3. The method as in claim 1 wherein said substrate is InP and said second semiconductor material is InGaAs.

4. The method as in claim 1 wherein said growth of said second semiconductor material is by molecular beam epitaxy.

5. The method as in claim 1 wherein said determination of $I^+, I^-$ and $\Delta I$ is made during the first four (4) consecutive waveform cycles.

6. The method as in claim 1 wherein said figure of merit FM is between 0 and 1.

7. The method of growing lattice matched thin films of InGaAs on an InP substrate by molecular beam epitaxy to form a surface normal multiple quantum well modulator at about 1.5 µm comprising the steps of:
   (a) initiating growth of said InGaAs film on said InP substrate;
   (b) monitoring intensity I of reflection high energy electron diffraction spot of the second semiconductor material and said substrate over multiple waveform cycles;
   (c) determining a maximum intensity $I^+$ and a minimum intensity $I^-$ of each waveform cycle;
   (d) determining the intensity drop $\Delta I$ from initial reflectivity, measured prior to initiating growth, to minimum reflectivity measured after starting growth;
   (e) calculating a normalized figure of merit FM for each said waveform cycle wherein $$FM = \frac{\Sigma(I^+ - I^-)}{\Delta I}$$

for each waveform cycle; and
   (f) adjusting In and Ga cell temperatures to maximize FM and optimize lattice matching; and
   (g) repeating steps (b)–(f) as needed to form a plurality of InGaAs layers.

8. The method as in claim 7 wherein said steps of determining maximum intensity, minimum intensity and intensity drop are made during the first four (4) consecutive waveform cycles following initiation of said growth of said InGaAs film.

* * * * *